United States Patent [19]

Leupold

[11] Patent Number: 4,893,103
[45] Date of Patent: Jan. 9, 1990

[54] SUPERCONDUCTING PYX STRUCTURES

[75] Inventor: Herbert A. Leupold, Eatontown, N.J.

[73] Assignee: The United States of America as represented by the Secretary of the Army, Washington, D.C.

[21] Appl. No.: 316,710

[22] Filed: Feb. 24, 1989

[51] Int. Cl.[4] .............................................. H01F 7/22
[52] U.S. Cl. .................................... 335/216; 335/306; 315/5.35; 505/1
[58] Field of Search ....................... 335/210, 216, 306; 315/5.26, 5.28, 5.34, 5.35; 505/1

[56] References Cited

U.S. PATENT DOCUMENTS

| | | | |
|---|---|---|---|
| 3,008,044 | 11/1961 | Buchhold | 335/216 X |
| 3,239,725 | 3/1966 | Wiederhold | 335/216 |
| 3,665,351 | 5/1972 | Donaldson et al. | 335/216 |
| 4,829,277 | 5/1989 | Stahura et al. | 335/306 |

Primary Examiner—George Harris
Attorney, Agent, or Firm—Michael Zelenka; John K. Mullarney

[57] ABSTRACT

A permanent magnet structure comprising one or more truncated hollow cylindrical flux source (HCFS) segments with the end faces of each segment covered by superconducting sheets. In the case of a plurality of axially aligned segments, the array may be arranged to provide a periodic magnet structure suitable for use in a wiggler.

7 Claims, 1 Drawing Sheet

SUPERCONDUCTING PYX STRUCTURES

The invention described herein may be manufactured, used, and licensed by or for the Government for governmental purposes without the payment to be of any royalties thereon.

TECHNICAL FIELD

The present invention relates in general to permanent magnet structures for use in electronic devices and, more particularly, to magnet structures for devices which act as high energy radiation sources, e.g. wigglers, undulators, free electron lasers.

BACKGROUND OF THE INVENTION

Many devices that employ magnetic fields have heretofore been encumbered by massive solenoids with their equally bulky power supplies. Thus, there has been increasing interest in the application of permanent magnet structures for such uses as electron-beam focusing and biasing fields. The current demand for compact, strong, static magnetic field sources that require no electric power supplies has created needs for permanent magnet structures of unusual form. A number of configurations have been designed and developed for electron beam guidance in millimeter wave microwave tubes of various types; for dc biasing fields in millimeter wave filters, circulators, isolators, striplines; for field sources in NMR (nuclear magnetic resonance) imagers; and so on. Especially promising for such purposes is the configuration based upon the hollow cylindrical flux source (HCFS) principle described by K. Halbach in "Proceedings of the Eighth International Workshop on Rare Earth Cobalt Permanent Magnets", Univ. of Dayton, Dayton, Ohio, 1985 (pp. 123-136). A HCFS, sometimes called a "magic ring", is a cylindrical permanent magnet shell which produces an internal magnetic field that is more or less constant in magnitude. The field is perpendicular to the axis of the cylinder, and furthermore the field strength can be greater than the remanence of the magnetic material from which the ring is made.

The ideal hollow cylindrical flux source (HCFS) is an infinitely long, annular cylindrical shell which produces an intense magnetic field in its interior working space. The direction of the magnetic field in the working space interior is perpendicular to the long axis of the cylinder. The aforementioned Halbach publication discloses a structure with an octagonal cross section which closely approximates the performance and field configuration of an ideal HCFS (which has a circular cross section). In both the ideal and Halbach configurations, no magnetic flux extends to the exterior of the ring structure (except at the ends of a finite cylinder).

The terms HCFS and "magic ring" as used herein encompasses not only the ideal cylindrical structure but also octagonal, sixteen sided, thirty-two-sided and even higher order polygonal-sided structures which approximates the ideal HCFS structure.

Unfortunately, the ideal HCFS structure is theoretically infinitely long. Thus, achievement of the desirable high uniform magnetic field in the interior of the magic ring structure demands that the structure be made extremely long (theoretically infinite). If the structure is not long enough, distortion of the interior fields will result.

Those concerned with the development of high power devices such as wigglers have continually searched for means to create intense uniform magnetic fields in confined spaces with lightweight devices.

SUMMARY OF THE INVENTION

It is therefore an object of this invention to provide a permanent magnet structure with compact external dimensions and a high uniform interior magnetic flux.

It is a further object of this invention to provide a permanent magnet structure with minimal external flux leakage.

It is another object of this invention to provide a permanent magnet structure with minimal internal field distortion.

The above and other objects are achieved in accordance with the present invention, which makes advantageous use of the HCFS structure uniquely combined with superconducting plates or sheets.

In one embodiment of the present invention an HCFS producing a uniform high field in the central cavity is truncated to produce a magnetic structure of finite length. When an HCFS is so truncated, the field no longer remains uniform due to the distortions caused by flux leakage from the open ends of the structure. To eliminate flux leakage a pair of superconducting plates or sheets, at least peripherally coextensive with the truncated flux source, are placed abutting the end faces of the same. A uniform field within the central cavity is thereby produced. The cavity provides a working space for applications requiring a uniform high field. To gain access to the interior of the structure, holes may be drilled through either the superconducting sheet(s) or the permanent magnet structure depending on purpose. As an additional advantage either or both superconducting sheets can be removed to provide access to the central cavity. One use for this embodiment of the present invention is as an oratron.

In another embodiment of the present invention a plurality of truncated HCFS structures are arranged in an axially aligned linear array so that their interior working space magnetic fields are 180° apart. That is, the interior magnetic fields of successive HCFS in the array alternate in direction. Superconducting sheets are sandwiched between adjacent truncated HCFS structures and also cover the end faces of the array. The superconducting sheets abutting the end faces of each truncated HCFS confine the flux or magnetic field to the interior of each ring, establish a uniform field in the interior, and isolate each ring from its oppositely oriented nearest neighbors thereby preventing distortion of the field by neighbor-induced counterfields.

BRIEF DESCRIPTION OF THE DRAWINGS

The invention will be more fully appreciated from the following detailed description when the same is considered in connection with the accompanying drawings in which.

DETAILED DESCRIPTION

Figure 1:
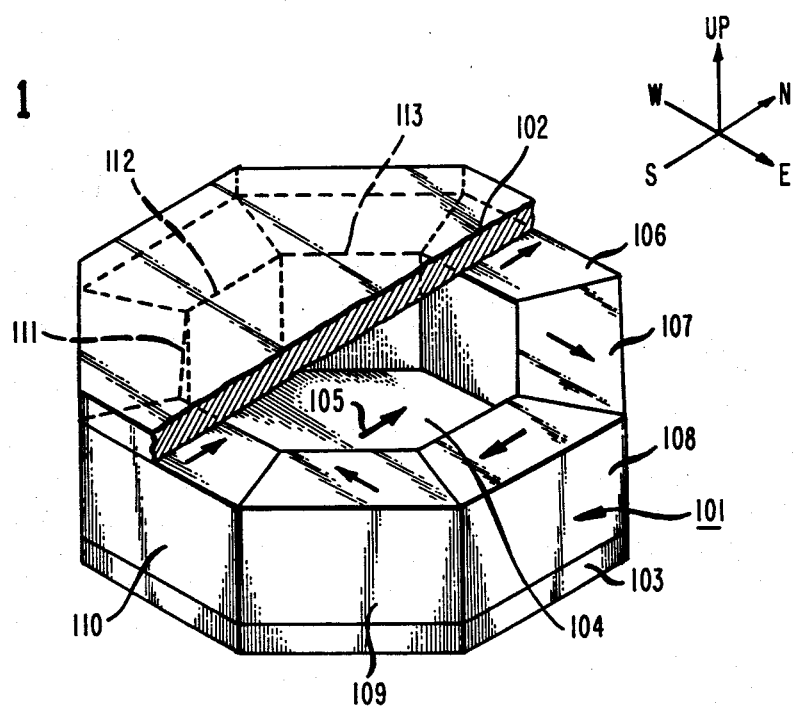
FIG. 1 is a perspective view of a truncated octagonal hollow cylindrical flux source structure with superconducting sheets abutting the end faces according to the present invention.

FIG. 1 shows an embodiment of the present invention which comprises a truncated hollow cylindrical flux source (HCFS) or "magic ring" 101 and a pair of superconducting sheets 102 and 103 covering the end faces of the truncated HCFS. The plates or sheets 102 and 103 are shown in FIG. 1 as being peripherally coextensive with the HCFS. However, as will be evident to those skilled in this art, the plates 102, 103 can extend beyond the flux source 101 in one or more directions. It is only important that they be not less in extent than the source 101.

As previously indicated, an ideal HCFS or "magic ring" is an annular cylindrical shell that produces an intense magnetic field in its central cavity. It is not feasible to construct an ideal HCFS, however, and so in practice a segmented approximation is resorted to. In such a configuration the magnetization is constant in both magnitude and direction within any one segment. Fortunately, even with as few as eight segments, more than 90 percent of the field of the ideal structure is obtainable.

In fact, an octagonal approximation to the ideal magic ring, such as shown in FIG. 1, appears suitable for almost all applications. The segmented and octagonal approximations to an ideal HCFS are disclosed in the article "Impact of the High-Energy Product Materials on Magnetic Circuit Design" by H. A. Leupold, et al, Materials Research Society Symposium, Proc. Vol. 96 (1957), pp. 279-306, esp 297.

A central cavity 104 exists in the interior of the HCFS/superconducting sheets pyx which contains a strong magnetic field designated by arrow 105.

Magnet segments 106, 107, 108, 109, 110, 111, 112 and 113 form sections of a truncated octagonal HCFS or "magic ring". If the ring formed by the eight segments were infinitely long, the magnetic field 105 in the interior of the HCFS would be substantially uniform within the interior. However, because each of the segments has finite length, there is distortion of the magnetic field in the interior. Unfortunately use of the magic ring in various electronic devices demands that the length of the magic ring be limited.

Each of the magic ring segments has a unique magnetic orientation or magnetization, M. For convenience, segments 106 and 110 will be referred to as magnetically oriented in a northerly direction. Thus, in the figure, segments 106 and 110 have arrows pointing in a northerly direction. Segments 108 and 112 are oriented in a southerly direction. Segments 107 and 111 are oriented in an easterly direction, while segments 109 and 113 are oriented in a westerly direction. (The aforementioned compass directions serve merely to provide a convenient frame of reference and should not be confused with magnetic north and south poles).

The magnetic field strength $H_w$ represented by arrow 105 within the working space of the HCFS is assumed to be known. Design procedures known to those skilled in the art permit one to calculate the magnetic field strength within the interior of a magic ring when the inner and outer radii of the ring are known, together with the remanence, $B_r$, of the magnetic material comprising the ring. For example, for an ideal, infinitely long magic ring, the magnetic field strength is given by $$H_w = B_r \ln (r_2/r_1)$$

where
$r_2$ = outer radius of ring
$r_1$ = inner radius of ring
$B_r$ = remanence of ring material Of course, the truncated HCFS illustrated in FIG. 1 has an octagonal cross section and so the above ideal formula does not give an entirely correct result. However, it is a close approximation. A more accurate value for $H_w$ is given by: $H_w = [B_r \sin (2\pi/M)]/(2\pi/M)$ where M is the number of segments in the approximation.

Since the magic ring is truncated, the field inside the working space is not uniform. However, the superconducting plates 102, 103 act as diamagnetic mirrors to the field abutting the plate surface. Thus, the image of the cavity field in the superconducting planes "continues" the cavity field longitudinally in both directions in space. Therefore, an infinitely long HCFS cavity appears (magnetically). Thus, the cavity field is made uniform.

There is normally flux leakage from the interior to the exterior of an open ring. However, a magnetic field cannot penetrate a superconducting plate. Therefore the addition of superconducting plates 102 and 103 to the end faces of the HCFS structure will prevent magnetic flux from escaping the interior of the pyx structure.

The plates or planar sheets 102 and 103 can, in bulk form, be composed of tin, lead, niobium, tantalum, etc. Each of these materials, and others, are known to be superconducting below a distinct critical temperature. Moreover, recent developments in the field of superconductivity have produced a large variety of new ceramic-type materials which are capable of achieving the superconducting state at critical temperatures above 77° K., the boiling point of liquid nitrogen. By way of example, an entire class of superconducting compounds with the chemical composition $RBa_2Cu_3O_{9-y}$ (where R stands for a transition metal or a rare earth ion and y is a number less than 9, preferably 2.1±0.05) has demonstrated superconductive properties above 90° K. The superconducting ceramics are formed by plasma-spraying techniques, or sputtered or evaporated onto a substrate (magnesium oxide), or produced by growing epitaxial films ($RBa_2Cu_3O_{7-x}$) on a substrate (e.g. $SrTiO_3$), etc. It is to be understood, however, that the present invention is in no way limited to the superconductivity material selected for the superconductor planar sheets or, if the same is a superconductive-ceramic, the manner in which the same is formed.

There are various techniques known to those skilled in the art for bringing (i.e., cooling) the superconductor plate material to its distinct critical temperature. For example, the use of cryorefrigerator means such as disclosed in the co-pending application of L. J. Jasper, Jr., Ser. No. 068,389, filed June 12, 1987, can be advantageously utilized to cool the superconducting plates. However, since the same comprises no part of the present invention and one or more of these known techniques will suffice for present purposes, further detailed discussion herein would not appear to be necessary.

This embodiment of the present invention can be used in any application requiring a uniform high field. Access holes can be drilled into either the superconducting sheets or into the HCFS depending on the purpose proposed for use of the invention. In addition the superconducting sheets may be removed for access into the central cavity. One example of the use of this embodiment is an oratron.

Figure 2:
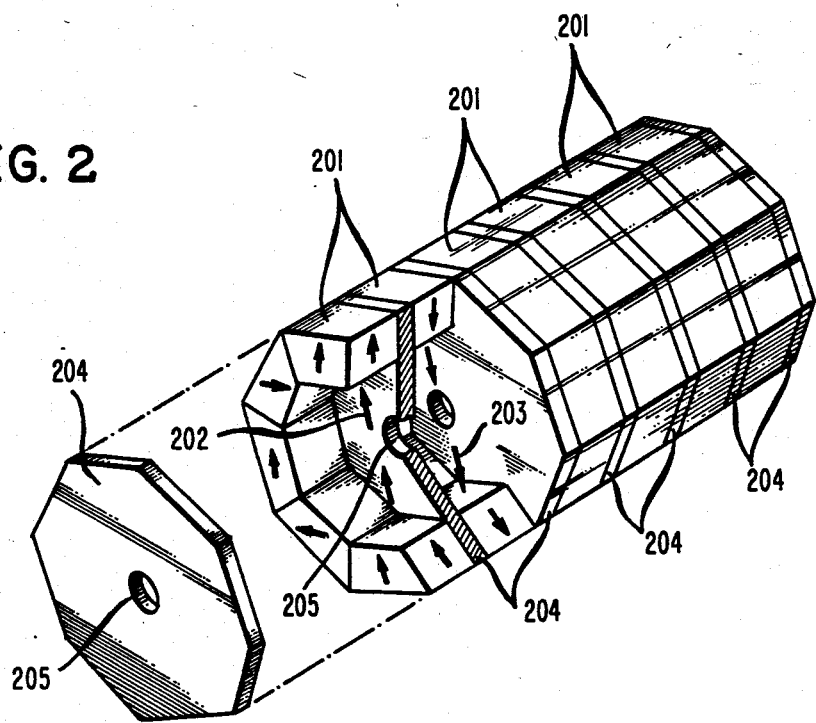
FIG. 2 is a perspective view of a plurality of the FIG. 1 structures arranged in a stack so that the interior magnetic fields continually alternate in direction, that is, the successive fields are 180° apart.

FIG. 2 shows a series of truncated HCFS structures 201 arranged to form a sequence of fields 202 and 203 of alternating up-down-up-down magnetization. The truncated HCFS structures are cut away for illustrative purposes to reveal the central cavity. These truncated HCFS structures are separated by superconducting sheets 204 which separate the adjacent cavities. The superconducting plates or sheets shown in the figure are typically quite thin. In practice, the only requirement is that the plates or sheets be thicker than the penetration depth of the specific superconducting material used. By way of example, the superconducting sheets might comprise a thick film one or more millimeters in thickness. Alternatively, if the superconducting plates are also intended to serve as "spacers" between adjacent permanent magnets, they will, of course, be thicker (e.g., several centimeters). Accordingly, it is to be understood that the present invention is in no way limited to any specific superconducting material or even the relative thickness of the same.

A bore hole 205 is drilled through each superconducting plate along the central axis of the array. This series of bore holes permits passage of an electron beam through the working central cavities of the HCFS array. This embodiment as described functions as a wiggler; a wiggler is a high power (megawatt) radiation source. In wiggler operation, an electron beam is injected into a drift region which is surrounded by a periodic magnet source. The periodic magnet source creates a magnetic field which changes in direction (by 180°) at fixed intervals, yet is always perpendicular to the principal direction of electron beam travel. When such a wiggler is constructed according to the present invention it can be termed a "pyx wiggler".

It is a feature of this invention to provide a permanent magnet structure with minimal internal field distortion within each segment of the pyx wiggler array. There are two sources of distortion effects, both of which are corrected by the present invention. These sources are (1) distortion caused by the bending of the field lines at the end faces of an open HCFS and (2) distortion caused by interference with incoming flux leaking from neighboring open segments. The addition of superconducting sheets 204 overcomes both these problems.

A superconducting surface does not permit a magnetic field to penetrate. The addition of the superconducting sheets confines outward flux leakage from the working cavity of the segment and thereby prevents the bending of the field lines at the end faces which would have occurred without the addition of the sheets. Therefore, the field is made substantially uniform. An alternate way to consider this effect utilizes the concept of diamagnetic mirrors. The superconducting sheets 204 magnetically mirror the field abutting the surfaces of the sheets. Thus, the field of each cavity appears to continue infinitely long in both directions when viewed from within each cavity. A theoretical HCFS is infinitely long. Therefore, a theoretical HCFS is created magnetically and in such an HCFS the field is uniform. The addition of superconducting sheets also prevents penetration of flux into neighboring cavities because no flux is capable of exiting each of these neighboring cavities. In this manner, the effect of interference from adjacent segments is eliminated, leaving the field within each pyx cavity unaffected by its neighbors. Both sources of distortion effects, that is, those caused by outward leakage and also those caused by incoming interference effects are eliminated by the addition of superconducting sheets. The goal of creating a uniform high field within each cavity is achieved.

Of course, truncated HCFS segments with circular cross sections or sixteen-sided cross sections, or thirty-two sided cross sections might also be employed in accordance with the present invention. Other components of the wiggler well known to those skilled in the art of design of such devices have been eliminated from the discussion. In a typical embodiment of the present invention, the array might consist of a series of ten magnetic pyxes. However, it should be borne in mind, that greater or fewer magnetic pyxes may be desirable in any given application.

Accordingly, having shown and described what is at present considered to be several preferred embodiments of the invention, it should be understood that the same has been shown by way of illustration and not limitation. And all modifications, alterations and changes coming within the spirit and scope of the invention are hereby meant to be included.

What is claimed is:

1. A permanent magnetic structure comprising at least one truncated hollow substantially cylindrical flux source for producing a uniform high-field in its central cavity, said high field being perpendicular to the axis of the truncated flux source, and a pair of superconducting plates covering the end faces of the truncated flux source.

2. A permanent magnetic structure defined in claim 1 wherein the superconducting plates are at least peripherally coextensive with the flux source.

3. A magnetic structure comprising a plurality of truncated hollow substantially cylindrical flux sources, said truncated flux sources being axially aligned in a linear array, each flux source serving to produce a uniform high field in its central cavity, and a pair of superconducting plates covering the end faces of each of the truncated flux sources.

4. A magnetic structure as defined in claim 3 wherein each superconducting plate has an axial bore hole to permit passage of an electron beam through the entire array.

5. A magnetic structure as defined in claim 4 wherein the magnetic fields in the central cavities of successive flux sources in said array alternate in direction.

6. A magnetic structure as defined in claim 5 wherein the direction of the magnetic fields in the central cavities are perpendicular to the axis of said linear array.

7. A magnetic structure as defined in claim 6 wherein the superconducting plates are at least peripherally coextensive with the plurality of flux sources.

* * * * *